(12) United States Patent
Yuasa

(10) Patent No.: US 7,852,157 B2
(45) Date of Patent: Dec. 14, 2010

(54) DIFFERENTIAL AMPLIFIER

(75) Inventor: Tachio Yuasa, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 33 days.

(21) Appl. No.: 12/379,586

(22) Filed: Feb. 25, 2009

(65) Prior Publication Data

US 2009/0231038 A1 Sep. 17, 2009

(30) Foreign Application Priority Data

Mar. 13, 2008 (JP) .............................. 2008-064284
Sep. 12, 2008 (JP) .............................. 2008-234639

(51) Int. Cl.
*H03F 3/45* (2006.01)
(52) U.S. Cl. ..................... 330/258; 330/257; 330/253
(58) Field of Classification Search ................. 330/258, 330/257, 253
See application file for complete search history.

(56) References Cited

U.S. PATENT DOCUMENTS

| | | | | |
|---|---|---|---|---|
| 5,334,948 A | * | 8/1994 | Fong et al. ................... | 330/253 |
| 5,483,194 A | * | 1/1996 | Genest ......................... | 330/253 |
| 5,847,600 A | * | 12/1998 | Brooks et al. .................. | 330/9 |
| 6,259,301 B1 | * | 7/2001 | Gailus et al. ................. | 327/355 |
| 6,504,432 B1 | * | 1/2003 | Rokhsaz ....................... | 330/258 |
| 7,365,600 B1 | * | 4/2008 | Lokere ........................ | 330/258 |
| 7,683,720 B1 | * | 3/2010 | Yehui et al. .................. | 330/311 |

OTHER PUBLICATIONS

Behzad Razavi, "Design of Analog CMOS Integrated Circuit", McGraw-Hill Higher Education, 2002, pp. 325-326, (Behzad).

* cited by examiner

*Primary Examiner*—Patricia Nguyen
(74) *Attorney, Agent, or Firm*—McGinn IP Law Group, PLLC

(57) ABSTRACT

A differential amplifier includes a differential amplifier section to generate a current composed of a differential-mode current and a first common-mode current according to a differential-mode component and a common-mode component of an input signal, a common-mode current generator section to generate a common-mode current according to the common-mode component of the input signal, and a current amplifier section to receive the current and the common-mode current, amplify a difference between the current and the common-mode current and output a result.

7 Claims, 5 Drawing Sheets

DIFFERENTIAL AMPLIFIER

BACKGROUND

1. Field of the Invention

The present invention relates to a differential amplifier and, particularly, to a differential amplifier that includes a differential pair in an input section.

2. Description of Related Art

A differential amplifier is widely used in an electronic circuit in order to perform signal amplification and signal processing operation. An example of a differential amplifier is disclosed in Behzad Razavi, "Design of Analog CMOS Integrated Circuit", McGraw-Hill Higher Education, 2002, pp 325 (Behzad). FIG. 5 shows a circuit diagram of a differential amplifier 100 disclosed in Behzad.

Referring to FIG. 5, the differential amplifier 100 includes transistors M101 to M109, M10A and M10B, voltage sources V101 to V104, input terminals IP and IM, an output terminal OUT, a power supply terminal VDD and a ground terminal GND. The transistors M101 to M107 are NMOS transistors, and the transistors M108, M109, M10A and M10B are PMOS transistors.

In the differential amplifier 100, an operating current, which is generated by the transistor M101 based on a voltage of the voltage source V101, is supplied to a differential pair formed by the transistors M102 and M103. Based on the operating current, the differential pair generates a differential-mode current according to input signals that are input through the input terminals IP and IM. The differential-mode current involves currents I102 and I103. Further, in the differential amplifier 100, reference currents I10A and I10B are generated. The reference current I10A is generated by the transistor M10A based on a voltage of the voltage source V102, and the reference current I10B is generated by the transistor M10B based on a voltage of the voltage source V102. The reference currents I10A and I10B have the same current value.

A result of subtracting the current I102 from the reference current I10A is a current I108. The current I108 becomes a current I105 after flowing through a current mirror circuit that is formed by the transistors M104 and M105. The current I105 serves as an output sink current to the output terminal OUT. On the other hand, a result of subtracting the current I103 from the reference current I10B is a current I109. The current I109 serves as an output source current to the output terminal OUT. In this manner, in the differential amplifier 100, the output source current and the output sink current to the output terminal OUT are generated based on the input signals.

The transistors M108 and M109 control the drains of the transistors M10A and M10B so as to maintain a constant voltage based on a voltage of the voltage source V103. The transistors M106 and M107 control the drains of the transistors M104 and M105 so as to maintain a constant voltage based on a voltage of the voltage source V104.

The currents I102, I103, I105, I109 and a voltage gain av are described hereinafter. The current I102 can be represented by the following expression (1) when a mutual conductance of the transistor M102 is gm102 and an input signal through the input terminal IP is VIP. The current I103 can be represented by the following expression (2) when a mutual conductance of the transistor M103 is gm103 and an input signal through the input terminal IM is VIM. The mutual conductance gm102 and gm103 are the same value.

$$I102 = gm102 * VIP + \frac{I101}{2} \quad (1)$$

$$I103 = gm103 * VIM + \frac{I101}{2} = gm102 * VIM + \frac{I101}{2} \quad (2)$$

The reference currents I10A and I10B can be represented by the following expressions (3) and (4), respectively.

$$I10A = I102 + I108 = I102 + I105 \quad (3)$$

$$I10B = I103 + I109 \quad (4)$$

Based on the expressions (1) and (3), the output sink current I105 can be represented by the following expression (5). Based on the expressions (2) and (4), the output source current I109 can be represented by the following expression (6).

$$I105 = I10A - I02 \quad (5)$$
$$= I10A - \left(gm102 * VIP + \frac{I101}{2}\right)$$

$$I109 = I10B - I03 \quad (6)$$
$$= I10B - \left(gm102 * VIM + \frac{I101}{2}\right)$$

A differential-mode component vo of an output voltage of the differential amplifier 100 can be represented by the following expression (7) when a drain resistance of the transistor M109 connected to the output terminal OUT is Rds109 and a drain resistance of the transistor M107 connected to the output terminal OUT is Rds107. In the expression (7), vip indicates the signal level of a differential-mode component of the input signal VIP, and vim indicates the signal level of a differential-mode component of the input signal VIM.

$$vo = (Rds109 // Rds107) * (I109 - I105) \quad (7)$$
$$= (Rds109 // Rds107) * \left( \begin{array}{c} I10B - \left(gm102 * VIM + \frac{I101}{2}\right) - \\ I10A + \left(gm102 * VIP + \frac{I101}{2}\right) \end{array} \right)$$
$$= (Rds109 // Rds107) * gm102 * (-vim + vip)$$

The voltage gain av of the differential amplifier 100 is represented by the following expression (8) from the output voltage represented by the expression (7).

$$av = \frac{vo}{(-vim + vip)} = gm102 * (Rds109 // Rds107) \quad (8)$$

SUMMARY

However, the present inventor has found the following problem. Based on the expressions (5) and (6), in order to stabilize the current I105 and the current I109 that determine the output voltage and the output current in the differential amplifier 100, it is necessary that the mutual conductance gm102 maintains a constant value. Further, in order to stabilize the voltage gain av, it is necessary that the mutual conductance gm102 and the drain resistance Rds107 and Rds109 maintain constant values.

Generally, however, the values of the mutual conductance gm and the drain resistance Rds of the transistors (e.g. MOSFET) that constitute the differential amplifier 100 vary depending on variations in a drain current ID. A drain current ID of a MOS transistor is represented by the following expression (9) in the saturation region operation of the MOS transistor when a carrier mobility of a channel is μ, a gate capacitance per unit area is Cox, a gate size is W/L, and Early voltage is VA.

$$ID = \frac{\mu Cox}{2} * \frac{W}{L} * (VGS - Vth)^2 * \left(1 + \frac{VDS}{VA}\right) \quad (9)$$

$$\cong \frac{\mu Cox}{2} * \frac{W}{L} * (VGS - Vth)^2$$

The mutual conductance gm and the drain resistance Rds can be calculated using the expression (9). The mutual conductance gm is represented by the following expression (10), and the drain resistance Rds is represented by the following expression (11).

$$gm = \frac{\partial ID}{\partial VGS} \quad (10)$$

$$= \mu Cox * \frac{W}{L} * (VGS - Vth)$$

$$= \sqrt{2 * ID * \mu Cox * \frac{W}{L}}$$

$$Rds = \frac{\partial VDS}{\partial ID} \quad (11)$$

$$= \frac{1}{\frac{\partial ID}{\partial VDS}}$$

$$= \frac{1}{\frac{1}{VA} * \frac{\mu Cox}{2} * \frac{W}{L} * (VGS - Vth)^2}$$

$$= \frac{VA}{ID}$$

The expressions (10) and (11) show that the mutual conductance gm and the drain resistance Rds vary depending on the value of the drain current ID. Further, if the signal levels of the input signals VIP and VIM vary, the currents I102 and I103 vary even if the current I101 maintains a stable current value, and accordingly, the mutual conductance gm102 of the transistor M102 varies. Further, the expressions (5) and (6) show that, if the signal levels of the input signals VIP and VIM vary, the current I105 and the current I109 vary, and accordingly, the drain resistance Rds107 of the transistor M107 through which the current I105 flows and the drain resistance Rds109 of the transistor M109 through which the current I109 flows vary.

As described above, in the differential amplifier 100, the voltage gain av is unstable due to variations in the signal levels of the input signals VIP and VIM. In an operational amplifier, it is desirable to maintain a constant value of the frequency characteristics of a voltage gain and a phase regardless of an operating state such as an input voltage of the operational amplifier. Particularly, in the case of forming a negative feedback circuit using a differential amplifier, it is significantly important that the relationship of the frequency characteristics of a voltage gain and a phase is stable in a system including the differential amplifier. However, it is difficult to maintain the stability in some applied uses if the differential amplifier is not stable.

An exemplary aspect of an embodiment of the present invention is a differential amplifier that includes a differential amplifier section to generate a current composed of a differential-mode current and a first common-mode current according to a differential-mode component and a common-mode component of an input signal, a common-mode current generator section to generate a second common-mode current according to the common-mode component of the input signal, and a current amplifier section to receive the current and the second common-mode current, amplify a difference between the current and the second common-mode current and output a result.

In the differential amplifier according to the exemplary aspect of an embodiment of the present invention, a differential-mode current and a common-mode current of an input signal are generated, and a difference between the differential-mode current and the common-mode current is amplified and output by the current amplifier section. Thus, a current flowing through a transistor constituting the current amplifier section is not subject to variations in an output current related to the common-mode current of the input signal. Therefore, the differential amplifier according to the exemplary aspect of an embodiment of the present invention enables reduction of variations in a drain resistance as represented by the expression (8), thereby reducing variations in the characteristics of the differential amplifier due to the signal level of the input signal.

In the differential amplifier according to the exemplary aspect of an embodiment of the present invention, it is possible to stabilize the characteristics regardless of the signal level of the input signal.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
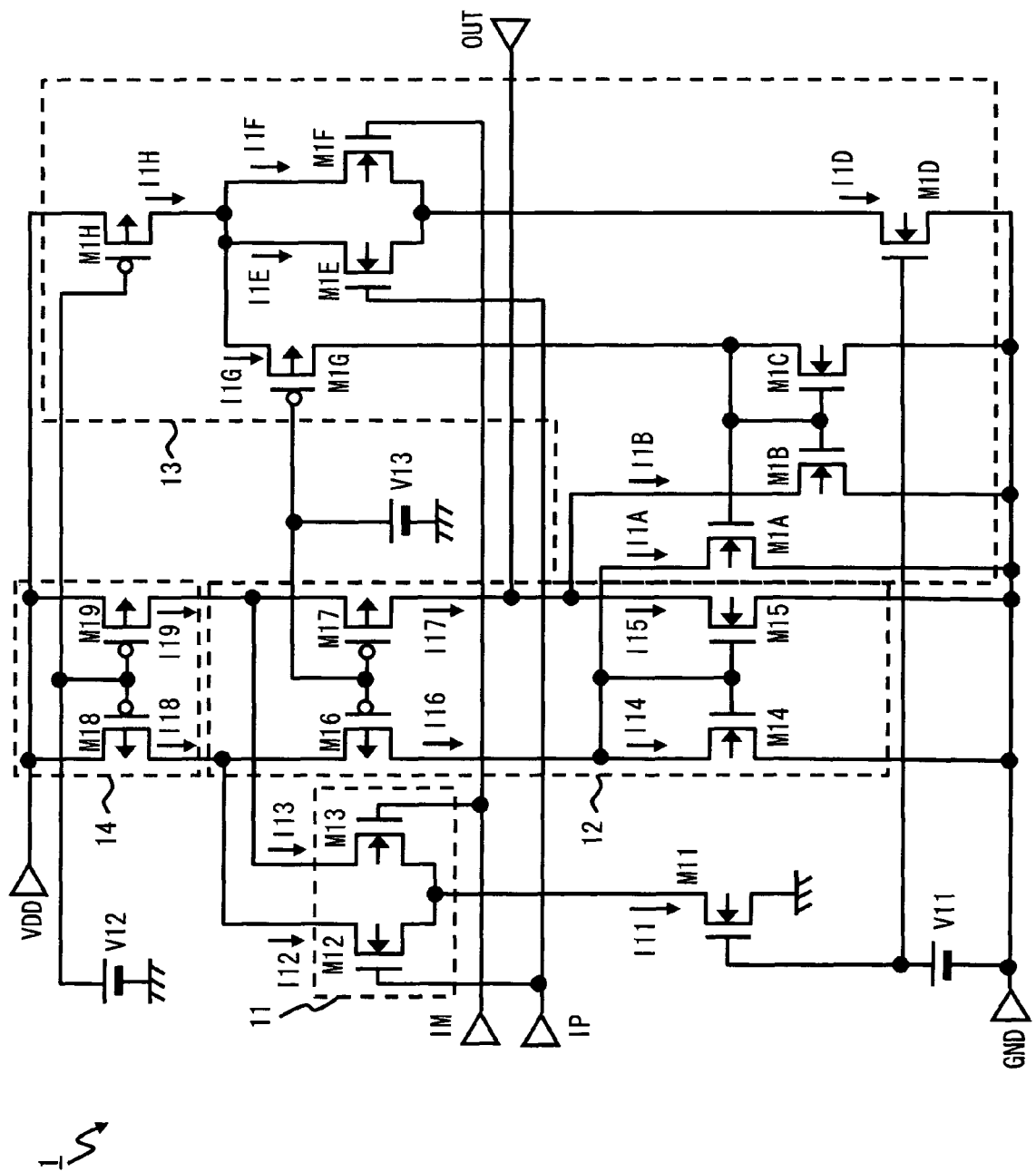
FIG. 1 is a circuit diagram of a differential amplifier according to a first exemplary embodiment.

An exemplary embodiment of the present invention is described hereinafter with reference to the drawings. FIG. 1 shows a circuit diagram of a differential amplifier 1 according to a first exemplary embodiment. Referring to FIG. 1, the differential amplifier 1 includes a differential amplifier section 11, a current amplifier section 12, a common-mode current generator section 13, and a first reference current source 14. The differential amplifier 1 further includes voltage sources V11 to V13. The voltage sources V11 to V13 supply voltages according to circuit operation to transistors constituting the differential amplifier 1.

The differential amplifier section 11 generates a differential-mode current according to a differential-mode component of an input signal. An input signals are input through an input terminal IP and IM. A signal input through the input terminal IP is referred to hereinafter as an input signal VIP, and a differential-mode component of the input signal VIP is referred to as vip. On the other hand, a signal input through the input terminal IM is referred to hereinafter as an input signal VIM, and a differential-mode component of the input signal VIM is referred to as vim. A differential-mode current in this exemplary embodiment involves a current I12 and a current I13, and the current I12 is one differential-mode current, and the current I13 is the other differential-mode current.

The current amplifier section 12 receives the differential-mode, current and a common-mode current that is generated in the common-mode current generator section 13, amplifies a difference between the differential-mode current and the common-mode current and outputs a result. The common-mode current generator section 13 receives input signals through the input terminals IP and IM just like the differential amplifier section 11. The common-mode current generator section 13 generates a common-mode current according to a common-mode component of the input signal. The common-mode current in this exemplary embodiment is equally included in the current I1A and the current I1B. The first reference current source 14 generates first reference currents I18 and I19. The first reference currents I18 and I19 are supplied to the current amplifier section 12 and used for a current amplifying operation in the current amplifier section 12.

The circuit configuration of each block of the differential amplifier 1 is described hereinafter in detail. The differential amplifier section 11 includes transistors M12 and M13 that form a first differential pair. The differential amplifier section 11 receives supply of an operating current from a transistor M11. In this exemplary embodiment, NMOS transistors are used as the transistors M11 to M13. The sources of the transistors M12 and M13 are connected in common at a common node. The transistor M12 is connected to the input terminal IP through the gate, and outputs one differential-mode current I12 through the drain. The transistor M13 is connected to the input terminal IM through the gate, and outputs the other differential-mode current I13 through the drain. The transistor M11 is connected to a ground terminal GND through the source, connected to the voltage source V11 through the gate, and connected to the common node of the differential pair through the drain. The differential-mode current I12 is represented by the following expression (12) when a mutual conductance of the transistor M12 is gm12. The differential-mode current I13 is represented by the following expression (13) when a mutual conductance of the transistor M13 is gm13 and it has the same value of gm12.

$$I12 = gm12 * VIP + \frac{I11}{2} \quad (12)$$

$$I13 = gm13 * VIM + \frac{I11}{2} = gm12 * VIM + \frac{I11}{2} \quad (13)$$

The first reference current source 14 includes transistors M18 and M19. In this exemplary embodiment, PMOS transistors are used as the transistors M18 and M19, and those transistors are designed to have substantially the same size. The transistor M18 is connected to a power supply terminal VDD through the source, and outputs the first reference current I18 through the drain. The first reference current I18 is generated by the transistor M18 according to a voltage value of the voltage source V12 that is connected to the gate of the transistor M18. The transistor M19 is connected to the power supply terminal VDD through the source, and outputs the first reference current I19 through the drain. The first reference current I19 is generated by the transistor M19 according to a voltage value of the voltage source V12 that is connected to the gate of the transistor M19.

The current amplifier section 12 includes transistors M14 to M17. In this exemplary embodiment, the transistors M14 and M15 are NMOS transistors, and the transistors M16 and M17 are PMOS transistors. The transistors M14 and M15 are designed to have the same size, and the transistors M16 and M17 are designed to have the same size.

The transistors M14 and M15 form a current mirror circuit. Specifically, the gates of the transistors M14 and M15 are connected in common, and the source of the transistors M14 and M15 are connected in common to the ground terminal GND. The gate and the drain of the transistor M14 are connected to each other. Further, the drain of the transistor M14 is connected to the drain of the transistor M16. The node connecting the drain of the transistor M14 and the drain of the transistor M16 is connected to a node to output one common-mode current I1A from the common-mode current generator section 13. The drain of the transistor M15 is connected to an output terminal OUT. Further, the drain of the transistor M15 is connected to a node to output the other common-mode current I1B from the common-mode current generator section 13.

The gates of the transistors M16 and M17 are connected in common and receive supply of a voltage from the voltage source V13. The source of the transistor M16 is connected to the drain of the transistor M12. Further, the transistor M16 receives supply of the first reference current I18 from the first reference current source 14. The transistor M16 controls the drain of the transistor M18 that generates the first reference current I18 so as to maintain a constant voltage according to the voltage of the voltage source V13, thereby stabilizing a voltage between the source and the drain of the transistor M18. Further, the transistor M16 outputs a current I16 that is a result of subtracting one differential-mode current I12 from the first reference current I18 through the drain.

The source of the transistor M17 is connected to the drain of the transistor M13. Further, the transistor M17 receives supply of the first reference current I19 from the first reference current source 14. The transistor M17 controls the drain of the transistor M19 that generates the first reference current I19 so as to maintain a constant voltage according to the voltage of the voltage source V13, thereby stabilizing a voltage between the source and the drain of the transistor M19. Further, the transistor M17 outputs a current I17 that is a result of subtracting the other differential-mode current I13 from the first reference current I19 through the drain. The drain of the transistor M17 is connected to the output terminal OUT.

The relationship of each current in the current amplifier section 12 is represented by the following expression (14).

$$I18=I12+I16=I19=I13+I17 \quad (14)$$

The common-mode current generator section 13 includes transistors M1A to M1H. In this exemplary embodiment, NMOS transistors are used as the transistors M1A to M1F, and PMOS transistors are used as the transistors M1G and M1H. The transistors M1A and M1B are designed to have a transistor size of m times larger than that of the transistor M1C. The transistors M1E and M1F form a second differential pair and are designed to have the same transistor size.

The transistor M1D is connected to the ground terminal GND through the source, connected to a common node of the second differential pair through the drain, and connected to the voltage source V11 through the gate. The transistor M1D generates a first operating current I1D according to a voltage of the voltage source V11 and supplies the first operating current I1D to a source-side common node of the transistors M1E and M1F that form the second differential pair.

The sources of the transistors M1E and M1F are connected in common, and the drains of the transistors M1E and M1F are also connected in common. The gate of the transistor M1E is connected to the input terminal IP. The transistor M1E generates a current I1E according to the input signal VIP that is input through the input terminal IP. The gate of the transistor M1F is connected to the input terminal IM. The transistor M1F generates a current I1F according to the input signal VIM that is input through the input terminal IM.

The transistor M1H is connected to the power supply terminal VDD through the source, and connected to a drain-side common node of the transistors M1E and M1F through the drain. Further, the transistor M1H is connected to the voltage source V12 through the gate. The transistor M1H generates a second operating current I1H according to a voltage value of the voltage source V12 and supplies the second operating current I1H to the drain-side common node of the second differential pair.

The transistor M1G is connected to the drain-side common node of the second differential pair through the source, and connected to the drain of the transistor M1C through the drain. Further, the transistor M1G is connected to the voltage source V13 through the gate. The transistor M1G controls the drain of the transistor M1H so as to maintain a voltage according to the voltage value of the voltage source V13. A voltage between the source and the drain of the transistor M1H is thereby stabilized. Further, the transistor M1G outputs a current I1G that is a difference between the second operating current I1H and the first operating current I1D (i.e. the sum of the current I1E and the current I1F) through the drain.

The currents I1E, I1F and I1G are described hereinbelow. The current I1E is represented by the following expression (15) when a mutual conductance of the transistor M1E is gm1E. The current I1F is represented by the following expression (16) when a mutual conductance of the transistor M1F is gm1F, there gm1F=gm1E. The current I1G is represented by the following expression (17) from the relationship of the currents.

$$I1E = gm1E * VIP + \frac{I1D}{2} \tag{15}$$

$$I1F = gm1F * VIM + \frac{I1D}{2} = gm1E * VIM + \frac{I1D}{2} \tag{16}$$

$$I1G = I1H - I1E - I1F \tag{17}$$

The transistor M1C forms a current mirror circuit together with the transistors M1A and M1B. The gate of the transistor M1C is connected in common to the gates of the transistors M1A and M1B. The sources of the transistors M1A to M1C are connected in common to the ground terminal GND. The gate and the drain of the transistor M1C are connected to each other. The drain of the transistor M1C is connected to the drain of the transistor M1G and receives a current I1G that is output from the drain of the transistor M1G.

The drain of the transistor M1A is connected to the node that connects the drain of the transistor M14 and the drain of the transistor M16. The transistor M1A outputs one common-mode current I1A based on the current I1G and multiplied by transistor size ratio of the transistor M1C to the transistor M1A.

The drain of the transistor M1B is connected to the node that connects the drain of the transistor M15 and the drain of the transistor M17. The transistor M1B outputs the other common-mode current I1B based on the current I1G and multiplied by transistor size ratio of the transistor M1C to the transistor M1B.

The currents I15 and I17 in consideration of the common-mode current are described hereinafter. The current I16 is represented by the following expression (18) when a transistor size ratio of the transistor M1C to the transistor M1A is m. The current I17 is represented by the following expression (19) when a transistor size ratio of the transistor M1C to the transistor M1B is m.

$$I16=I14+I1A=I14+m*I1G \tag{18}$$

$$I17=I15+I1B=I15+m*I1G \tag{19}$$

Based on the expressions (18) and (19), an output sink current (e.g. the current I15) and an output source current (e.g. the current I17—the current I1B) to the output terminal OUT are represented by the expressions (20) and (21), respectively.

$$I15 = I14 = I16 - m * I1G \tag{20}$$
$$= I18 - I12 - m * I1G$$
$$= I18 - gm12 * VIP - \frac{I11}{2} - m *$$
$$(I1H - gm1E * (VIP + VIM) - I1D)$$

$$I17 - I1B = I18 - I13 - m * I1G \tag{21}$$
$$= I18 - gm12 * VIM - \frac{I11}{2} - m *$$
$$(I1H - gm1E * (VIP + VIM) - I1D)$$

In the differential amplifier 1 described above, an output voltage vo is represented by the following expression (22) when a drain resistance of the transistor M17 is Rds17 and a drain resistance of the transistor M15 is Rds15.

$$vo = (Rds17 // Rds15) * (I17 - I1B - I15) \tag{22}$$
$$= (Rds17 // Rds15) * gm12 * (VIP - VIM)$$

The expression (22) shows that the output voltage is generated based on a voltage difference between the input signal VIP and the input signal VIM, which is a differential-mode component, in the differential amplifier 1 according to the exemplary embodiment. Therefore, by setting VIP=VIM, the variance of the output sink current (e.g. the current I15) and the output source current (e.g. the current I17—the current I1B) due to the common-mode component of the input signal can be analyzed. The output sink current and the output source current due to the common-mode component are represented by the following expressions (23) and (24), respectively.

$$I15 = (2m * gm1E - gm12) * VIP + I18 - \frac{I11}{2} - m * (I1H - I1D) \tag{23}$$

-continued $$I17 - I1B = \qquad (24)$$
$$(2m*gm1E - gm12)*VIM + I18 - \frac{I11}{2} - m*(I1H - I1D)$$

In this exemplary embodiment, the transistor M12 and the transistor M13 that form the first differential pair have the same characteristics, and the transistor M1E and the transistor M1F that form the second differential pair have the same characteristics. This means that the mutual conductance of the transistors forming the first differential pair and the mutual conductance of the transistors forming the second differential pair have the relationship represented by the following expression (25).

$$gm12 = 2m*gm1E \qquad (25)$$

By forming the first differential pair and the second differential pair based on the relationship represented by the expression (25), the expressions (23) and (24) can be represented by the following expression (26).

$$I15 = I17 - I1B = I18 - \frac{I11}{2} - m*(I1H - I1D) \qquad (26)$$

The expression (26) shows that the output source current and the output sink current maintain a constant value with respect to the common-mode component of the input signal regardless of the voltage level of the common-mode component in the differential amplifier 1 according to the exemplary embodiment.

As described above, in the differential amplifier 1 according to the exemplary embodiment, the sum of the current I1E and the current I1F that are generated by the second differential pair maintain a constant value regardless of the differential-mode component of the input signal. Further, the sum of the current I1E and the current I1F has a value in proportion to the common-mode component of the input signal. Then, by subtracting the current I1E and the current I1F from the second operating current that is a constant current, the common-mode current based on the common-mode component of the input signal is generated. On the other hand, the differential-mode current that is generated in the differential amplifier section 11 is subject to variations due to the common-mode component of the input signal in addition to variations due to the differential-mode component of the input signal. In light of this, in the differential amplifier 1, the common-mode current generated in the common-mode current generator section 13 is subtracted from the differential-mode current generated in the differential amplifier section 11, so that variations in the output current are caused by the differential-mode component of the input signal only.

Therefore, in the differential amplifier 1 according to the exemplary embodiment, the output sink current and the output source current to the output terminal OUT have variations according to the differential-mode component of the input signal only, and they have constant values with respect to the common-mode component. The common-mode components of the output sink current and the output source current thereby become constant, and consequently, the drain resistances Rds of the transistor M15 and the transistor M17, which affect the stability of the voltage gain av, become constant regardless of the common-mode component of the input signal. The differential amplifier 1 thereby enables stabilization of the voltage gain av and its characteristics.

In the differential amplifier 1, it is necessary that the characteristics of the mutual conductance of the transistors that form the first differential pair and the second differential pair (e.g. the transistors M12 and M13 and the transistors M1E and M1F) are the same in each differential pair. By placing the transistors that form the differential pair adjacent or close to each other in the semiconductor layout, it is possible to improve the relative accuracy of the mutual conductance of a plurality of transistors. Further, by placing a plurality of differential pairs adjacent or close to each other, it is possible to improve the relative accuracy of the mutual conductance of the differential pairs. In this manner, it is relatively easy to match the mutual conductance in the differential amplifier 1, and it is possible to realize the stable characteristics with respect to variations in the common-mode component of the input signal with use of the common-mode current generator section 13.

Second Exemplary Embodiment

Figure 2:
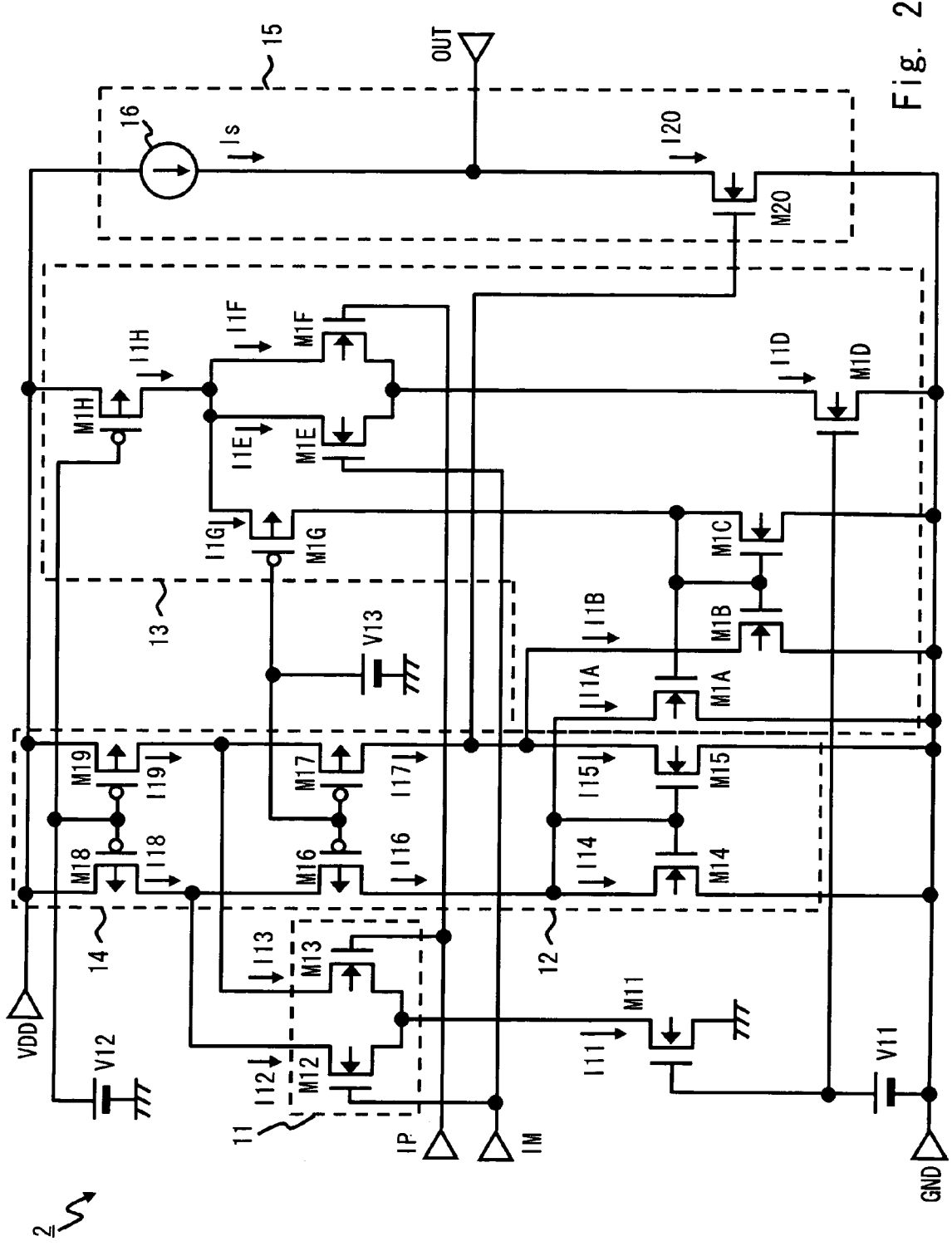
FIG. 2 is a circuit diagram of a differential amplifier according to a second exemplary embodiment.

FIG. 2 shows a circuit diagram of a differential amplifier 2 according to a second exemplary embodiment. Referring to FIG. 2, the differential amplifier 2 is configured by additionally connecting an output buffer 15 to the output of the current amplifier section 12 of the differential amplifier 1 according to the first exemplary embodiment. In the differential amplifier 2, the output terminal OUT is connected through the output buffer 15. With the addition of the output buffer 15, the input terminals IP and IM in the differential amplifier 2 are connected in the opposite manner to those in the differential amplifier 1.

The output buffer 15 includes a transistor M20 and an output current source 16. The transistor M20 is an NMOS transistor, for example. The transistor M20 is connected to the ground terminal GND through the source and connected to the output current source 16 through the drain. The output terminal OUT is connected to a node between the transistor M20 and the output current source 16. The gate of the transistor M20 is connected to the output of the current amplifier section 12. The output current source 16 is connected between the power supply terminal VDD and the output terminal OUT.

Further, in the differential amplifier 2, a current I20 and a current Is that is output from the output current source 16 are designed to be the same in order to minimize an offset voltage in the output terminal OUT. Furthermore, the transistor M20 lets the current I20 flow according to the output of the current amplifier section 12. In this exemplary embodiment, the relationship between the current I20 and the current I15 is represented by the following expression (27) when n is a transistor size ratio of the transistor M15 (or the transistor M14) to the transistor M20.

$$I20 = n*I15 \qquad (27)$$

An input voltage to the transistor M20 of the output buffer 15 is preferably a voltage near the threshold of the transistor M20. If an input voltage to the transistor M20 is significantly higher than the threshold voltage, the waste of power consumption increases because the current that flows from the output current source 16 to the ground terminal GND during no signal input becomes larger. In this exemplary embodiment, the drain currents I14 and I15 of the transistors M14 and M15 are substantially equal during no signal input. Accordingly, a voltage input to the gate of the transistor M20 during no signal input is substantially equal to the threshold voltage of the transistor M14. Therefore, by setting the threshold voltage of the transistor M20 to be slightly higher than the threshold voltage of the transistor M14, it is possible to reduce the above waste of the power consumption.

Third Exemplary Embodiment

Figure 3:
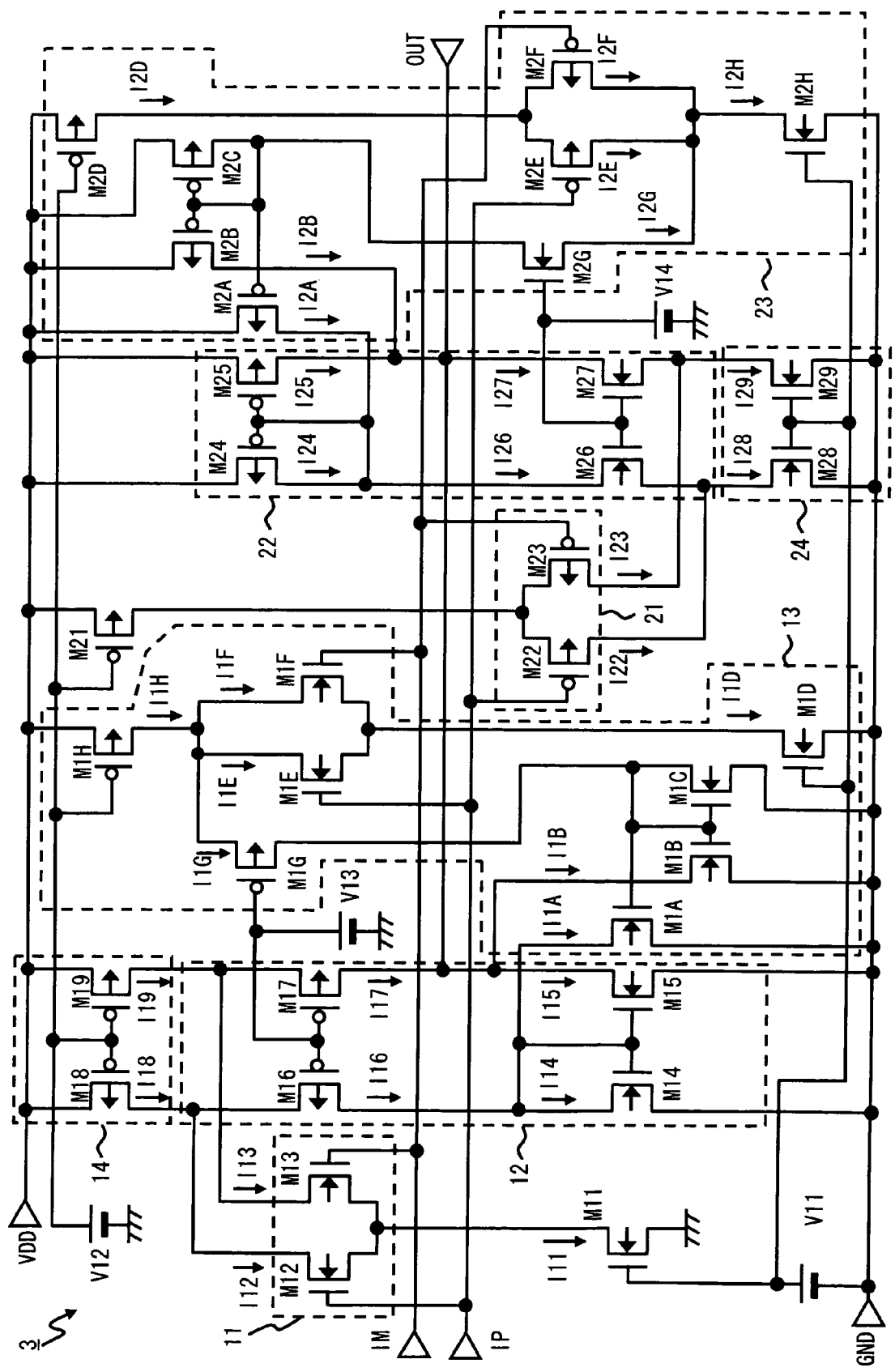
FIG. 3 is a circuit diagram of a differential amplifier according to a third exemplary embodiment.

FIG. 3 shows a circuit diagram of a differential amplifier 3 according to a third exemplary embodiment. Referring to FIG. 3, the differential amplifier 3 includes a second differential amplifier section 21 composed of PMOS transistors, in addition to the differential amplifier section 11 (which is referred to hereinafter for convenience as a first differential amplifier section) composed of NMOS transistors, which is used in the differential amplifiers 1 and 2. The differential amplifier 3 is thereby compatible with a wider range of input voltage than the differential amplifiers 1 and 2.

The differential amplifier 3 includes the second differential amplifier section 21, a second current amplifier section 22, a second common-mode current generator section 23 and a second reference current source 24, in addition to the first differential amplifier section 11, the current amplifier section (which is referred to hereinafter for convenience as a first current amplifier section) 12, the common-mode current generator section (which is referred to hereinafter for convenience as a first common-mode current generator section) 13 and the first reference current source 14, which are used in the differential amplifier 1.

The second differential amplifier section 21, the second current amplifier section 22, the second common-mode current generator section 23 and the second reference current source 24 include transistors corresponding to, but having opposite polarity from, the transistors constituting the first differential amplifier section 11, the first current amplifier section 12, the first common-mode current generator section 13 and the first reference current source 14, respectively. The differential amplifier 3 further includes a voltage source V14 that corresponds to the voltage source V13.

For example, transistors M21 to M25 and transistors M2A to M2F corresponding to the transistors M11 to M15 and the transistors M1A to M1F are PMOS transistors. Transistors M26 to M29 and transistors M2G and M2H corresponding to the transistors M16 to M19 and the transistors M1G and M1H are NMOS transistors.

The operations of the second differential amplifier section 21, the second current amplifier section 22, the second common-mode current generator section 23 and the second reference current source 24 correspond to the operations of the first differential amplifier section 11, the first current amplifier section 12, the first common-mode current generator section 13 and the first reference current source 14, respectively, except that the polarity of the current handled therein are different. In the differential amplifier 3, the output of the first current amplifier section 12 and the output of the second current amplifier section 22 are connected in common to the output terminal OUT. Thus, in the output terminal OUT, the output of the first current amplifier section 12 and the output of the second current amplifier section 22 are combined.

In the differential amplifier 3 according to the third exemplary embodiment, an input signal on the high potential side is amplified using the first differential amplifier section 11, the first current amplifier section 12, the first common-mode current generator section 13 and the first reference current source 14, and an input signal on the low potential side is amplified using the second differential amplifier section 21, the second current amplifier section 22, the second common-mode current generator section 23 and the second reference current source 24. This enables compatibility with a wide range of input voltage. Further, the use of the differential amplifier 3 enables compatibility with rail-to-rail operation in which an input voltage range and an output voltage range are from a ground voltage to a power supply voltage.

In the differential amplifier 3 as well, it is possible to improve the stability of the characteristics of the differential amplifier because the current flowing through the transistor connected to the output terminal OUT is not subject to variations due to the common-mode component of the input signal.

Fourth Exemplary Embodiment

Figure 4:
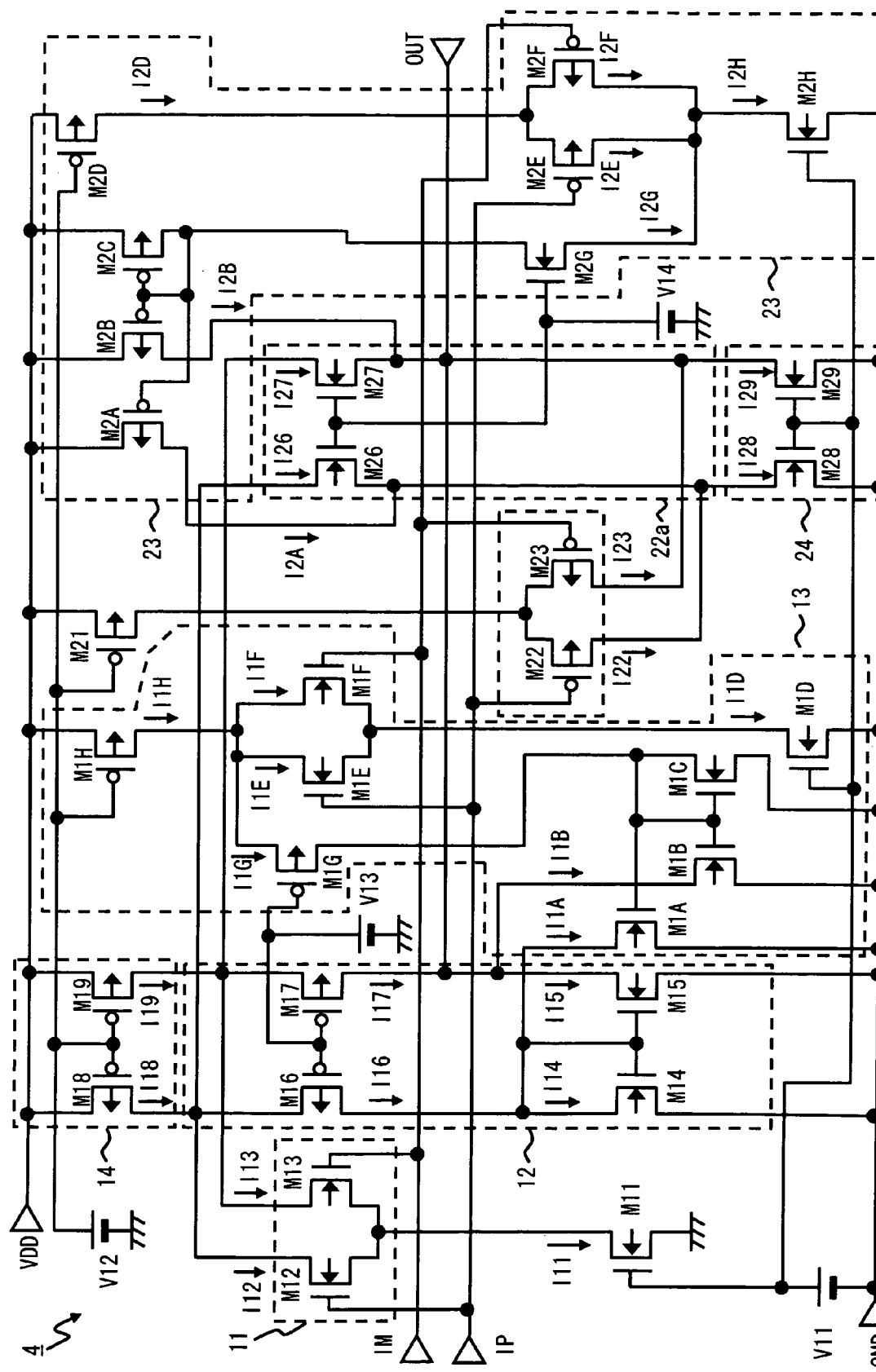
FIG. 4 is a circuit diagram of a differential amplifier according to a fourth exemplary embodiment.
Figure 5:
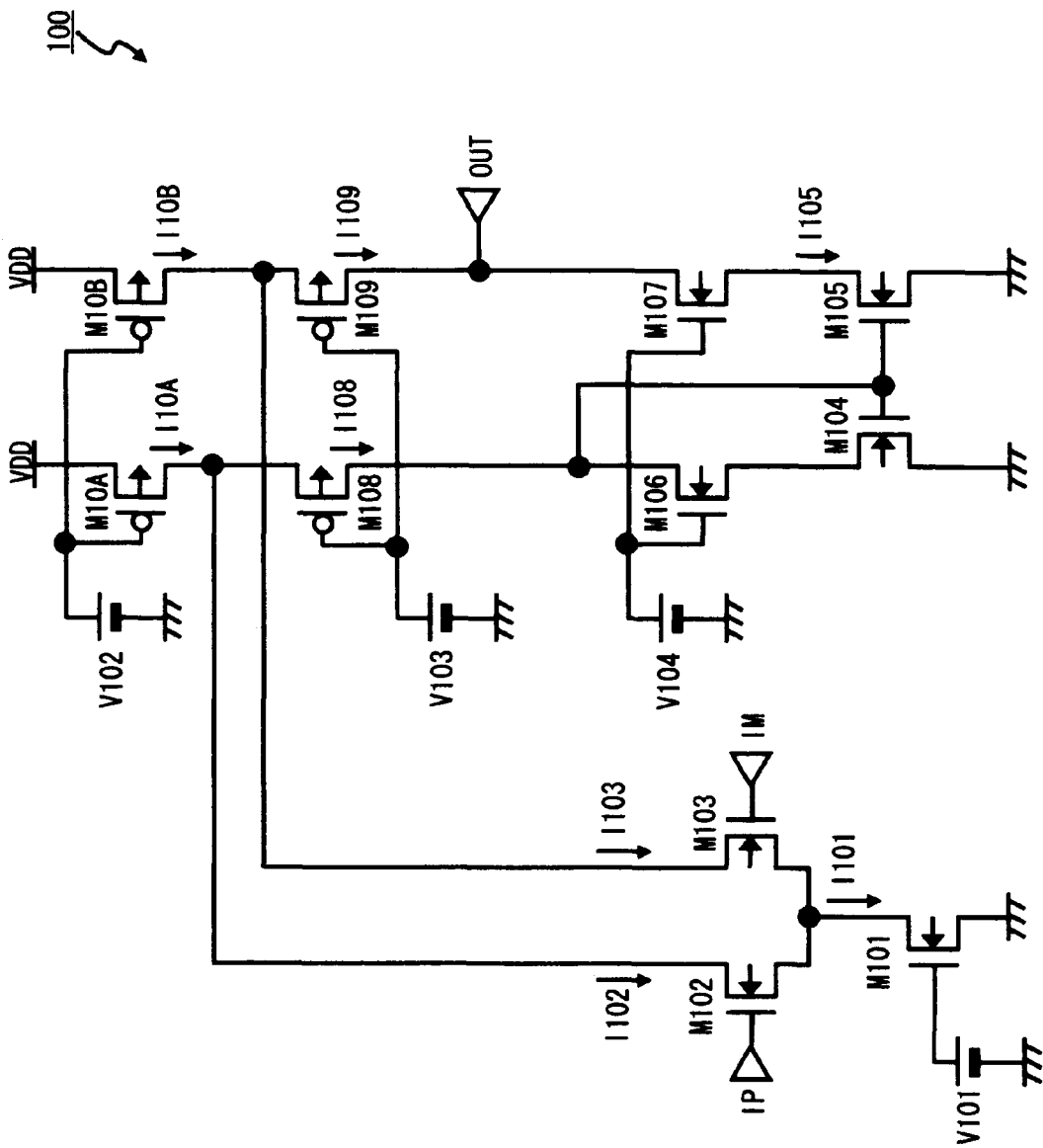
FIG. 5 is a circuit diagram of a differential amplifier according to a prior art.

FIG. 4 shows a circuit diagram of a differential amplifier 4 according to a fourth exemplary embodiment. The differential amplifier 4 is an alternative example of the differential amplifier 3 according to the third exemplary embodiment. The differential amplifier 4 includes a second current amplifier section 22a that is an alternative example of the second current amplifier section 22.

In the second current amplifier section 22a, the transistors M24 and M25, which are included in the second current amplifier section 22, are eliminated. The drain of the transistor M26 is connected to the drain of the transistor M12, instead of the drain of the transistor M24. The drain of the transistor M27 is connected to the drain of the transistor M13, instead of the drain of the transistor M25. Further, the source of the transistor M26 is connected to the drain of the transistor M2A. The source of the transistor M27 is connected to the drain of the transistor M2B. By eliminating the transistors M24 and M25, the circuit area is reduced in the differential amplifier 4.

An NMOS transistor and a PMOS transistor basically have different characteristics. Therefore, the characteristics are different between the drain currents I12 and I13 and the drain currents I22 and I23 that are output for the input signals VIP and VIM. It is difficult to eliminate the difference in drain current because even if the characteristics of a PMOS transistor and an NMOS transistor are designed to be the same in the design phase, the same characteristics of the PMOS transistor and the NMOS transistor are not maintained due to fluctuations in the manufacturing phase. Thus, it does not largely affect the characteristics of the differential amplifier when the configurations of the first differential amplifier section 11 and the second differential amplifier section 21 are not completely symmetric. The differential amplifier 4 can thereby realize substantially the same performance as the differential amplifier 3 according to the third exemplary embodiment.

The first to fourth exemplary embodiments can be combined as desirable by one of ordinary skill in the art. Further, the output buffer 15 described in the second exemplary embodiment may be added to the differential amplifier described in the third and fourth exemplary embodiments. In this case, it is necessary to invert the polarity of the input terminals. Furthermore, the differential amplifier according to exemplary embodiments of the present invention may be configured using bipolar transistors. In this case, an N-channel transistor is replaced with an NPN transistor, and a P-channel transistor is replaced with a PNP transistor. The emitter of a bipolar transistor corresponds to the source of a MOSFET, the collector of a bipolar transistor corresponds to the drain of a MOSFET, and the base of a bipolar transistor corresponds to the gate of a MOSFET.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A differential amplifier comprising:
   a differential amplifier section to generate a current composed of a differential-mode current and a first common-mode current according to a differential-mode component and a common-mode component of an input signal;
   a common-mode current generator section to generate a second common-mode current according to the common-mode component of the input signal; and
   a current amplifier section to receive the current and the second common-mode current, amplify a difference between the current and the second common-mode current and output a result.

2. The differential amplifier according to claim 1, wherein the second common-mode current is equal to the first common-mode current.

3. The differential amplifier according to claim 2, wherein the common-mode current generator section comprises:
   a second differential pair formed by transistors of the same conductivity type as a first differential pair in the differential amplifier, the transistors having sources and drains respectively connected in common or emitters and collectors respectively connected in common;
   a first current source connected to a common node on source or emitter side of the second differential pair, to supply a first operating current to the second differential pair;
   a second current source connected to a common node on drain or collector side of the second differential pair, to supply a second operating current to the second differential pair; and
   a current mirror circuit connected to the common node on drain or collector side, to receive a common-mode current being a difference between the first operating current and the second operating current and output the common-mode current as the second common-mode current.

4. The differential amplifier according to claim 3, wherein one input terminal of the first differential pair and one input terminal of the second differential pair are connected in common, and another input terminal of the first differential pair and another input terminal of the second differential pair are connected in common.

5. The differential amplifier according to claim 1, wherein
   the differential amplifier section includes a first differential amplifier section and a second differential amplifier section,
   the common-mode current generator section includes a first common-mode current generator section and a second common-mode current generator section,
   the current amplifier section includes a first current amplifier section placed corresponding to the first differential amplifier section and the first common-mode current generator section, and a second current amplifier section placed corresponding to the second differential amplifier section and the second common-mode current generator section,
   the first differential amplifier section and the first common-mode current generator section respectively comprise a first differential pair formed by transistors of a first conductivity type,
   the second differential amplifier section and the second common-mode current generator section respectively comprise a second differential pair formed by transistors of a second conductivity type, and
   an output terminal of the first current amplifier section and an output terminal of the second current amplifier section are connected in common.

6. The differential amplifier according to claim 5, wherein the second current amplifier section operates by receiving a differential-mode current generated in the first differential amplifier section and a differential-mode current generated in the second differential amplifier section.

7. The differential amplifier according to claim 1, further comprising:
   an output buffer to receive an output current from the current amplifier section, amplify the output current and output a result.

* * * * *